United States Patent
Hsiao et al.

(10) Patent No.: US 12,418,134 B2
(45) Date of Patent: Sep. 16, 2025

(54) ELECTRICAL CONNECTION BASE, ELECTRICAL CONNECTION BASE ASSEMBLY WITH ENHANCED LOAD-BEARING AND SUPPORTIVE ABILITY, AND ELECTRICAL CONNECTOR

(71) Applicant: Fulian Precision Electronics (Tianjin) Co., LTD., Tianjin (CN)

(72) Inventors: Yi-Pei Hsiao, New Taipei (TW);
Hsiang-Yu Lien, New Taipei (TW);
Tung-Ho Shih, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 525 days.

(21) Appl. No.: 17/943,409

(22) Filed: Sep. 13, 2022

(65) Prior Publication Data

US 2023/0080399 A1    Mar. 16, 2023

(30) Foreign Application Priority Data

Sep. 13, 2021  (CN) .......................... 202111070764.4

(51) Int. Cl.
| | | |
|---|---|---|
| *H01R 12/72* | (2011.01) | |
| *H01R 12/73* | (2011.01) | |
| *H01R 13/502* | (2006.01) | |
| *H01R 13/631* | (2006.01) | |
| *H01R 13/635* | (2006.01) | |

(52) U.S. Cl.
CPC ......... *H01R 13/502* (2013.01); *H01R 12/737* (2013.01); *H01R 13/631* (2013.01); *H01R 13/635* (2013.01)

(58) Field of Classification Search
CPC .. H01R 13/502; H01R 12/737; H01R 13/631; H01R 13/635; H01R 12/716; H05K 3/366
See application file for complete search history.

(56) References Cited

U.S. PATENT DOCUMENTS 5,577,922 A * 11/1996 Enomoto ............. H05K 7/1409
439/157
10,177,476 B1 * 1/2019 Phillips ................. H01R 12/79
(Continued)

FOREIGN PATENT DOCUMENTS

CN    214014622 U    8/2021
TW    507518 B    10/2002
(Continued)

*Primary Examiner* — Abdullah A Riyami
*Assistant Examiner* — Nelson R. Burgos-Guntin
(74) *Attorney, Agent, or Firm* — ScienBiziP, P.C.

(57) ABSTRACT

An electrical connection base providing support for heavy expansion cards includes a pedestal and a supporting element. A socket is defined on the pedestal. The supporting element includes installation and support portion. A through hole is defined on the installation portion, which is portion set outside the pedestal, the pedestal entering the through hole. The support portion has a first slot, and the first slot runs through the end of the support portion away from the installation portion. The portion of the expansion card or other element plugged into the socket and outside the pedestal is inserted into the first slot. The groove wall of the first slot is in contact with the element, the support portion thereby supports the card or element and prevents strain and deformation.

20 Claims, 10 Drawing Sheets

(56) References Cited

U.S. PATENT DOCUMENTS

| | | | |
|---|---|---|---|
| 2002/0031952 A1* | 3/2002 | Hashimoto | H01R 12/83 439/637 |
| 2005/0287834 A1* | 12/2005 | Nishimura | H01R 12/592 439/67 |
| 2008/0050962 A1* | 2/2008 | Chen | H01R 13/631 439/358 |
| 2013/0128471 A1 | 5/2013 | Kuo et al. | |
| 2016/0336667 A1* | 11/2016 | Kee Mew | H01R 12/7005 |
| 2019/0036251 A1* | 1/2019 | Kolivoski | H01R 12/716 |
| 2019/0097335 A1* | 3/2019 | Kee Mew | H01R 12/58 |
| 2019/0109392 A1* | 4/2019 | Phillips | H01R 12/737 |
| 2019/0181574 A1* | 6/2019 | Herring | H05K 1/00 |
| 2019/0372257 A1* | 12/2019 | Chen | H01R 12/7005 |
| 2020/0127397 A1* | 4/2020 | Fang | H01R 12/7005 |

FOREIGN PATENT DOCUMENTS

| | | |
|---|---|---|
| TW | M468606 U | 12/2013 |
| TW | 717186 B | 1/2021 |

\* cited by examiner

ELECTRICAL CONNECTION BASE, ELECTRICAL CONNECTION BASE ASSEMBLY WITH ENHANCED LOAD-BEARING AND SUPPORTIVE ABILITY, AND ELECTRICAL CONNECTOR

FIELD

The subject matter herein generally relates to housings.

BACKGROUND

As the functions and capabilities of external circuit boards such as expansion cards increase, components such as weighty heat-dispersing structures may also be installed on the expansion cards, resulting in an increase of loading on the expansion card. The expansion card is supported by the connector, but the load-bearing part of the expansion card is not supported, which may cause deformation and damage to the expansion card.

BRIEF DESCRIPTION OF THE DRAWINGS

Many aspects of the disclosure could be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
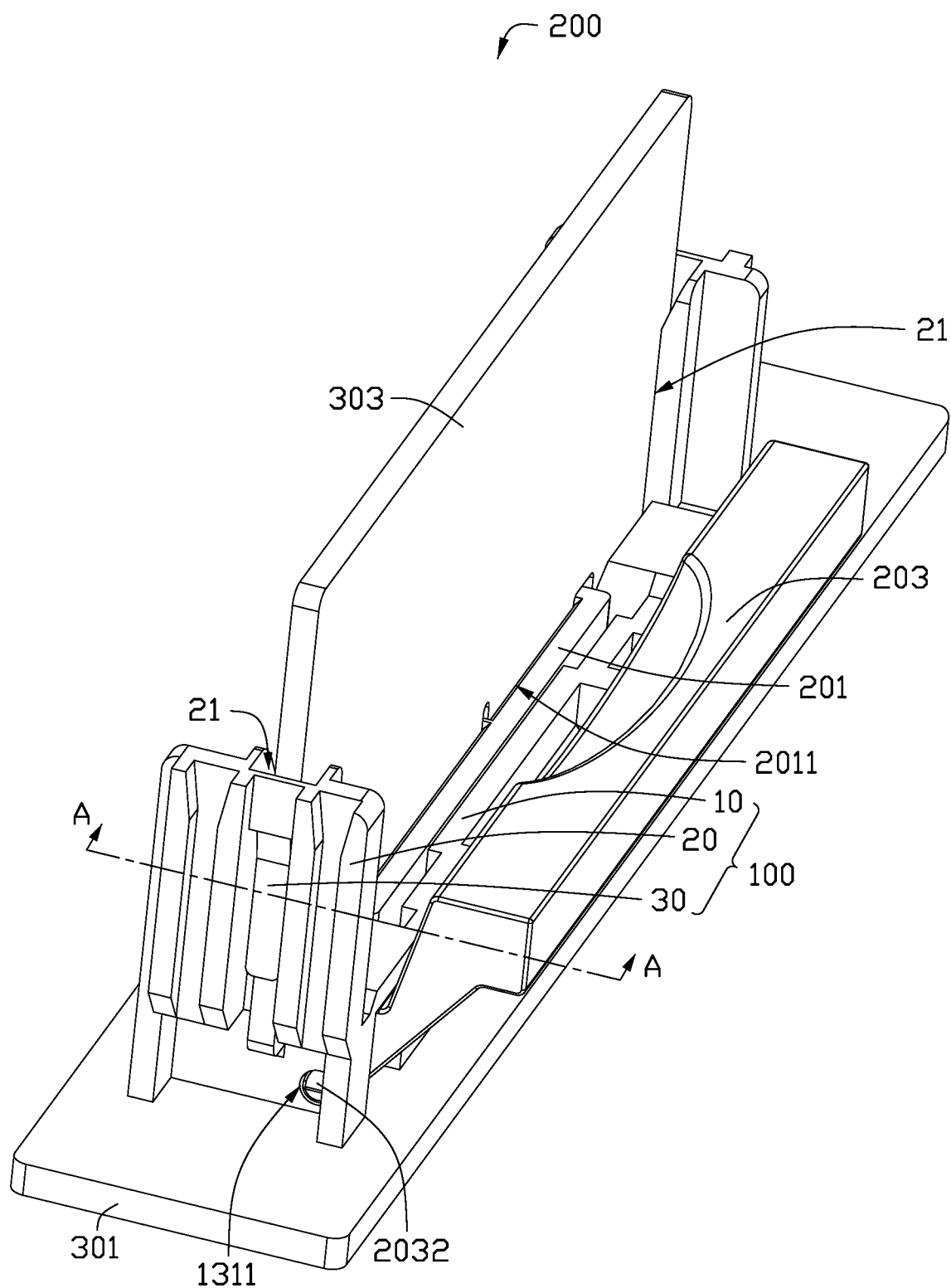
FIG. 1 is an isometric, assembled view of an electrical connection base connecting a first circuit board and a second circuit board provided by an embodiment of the present application.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein could be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection could be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
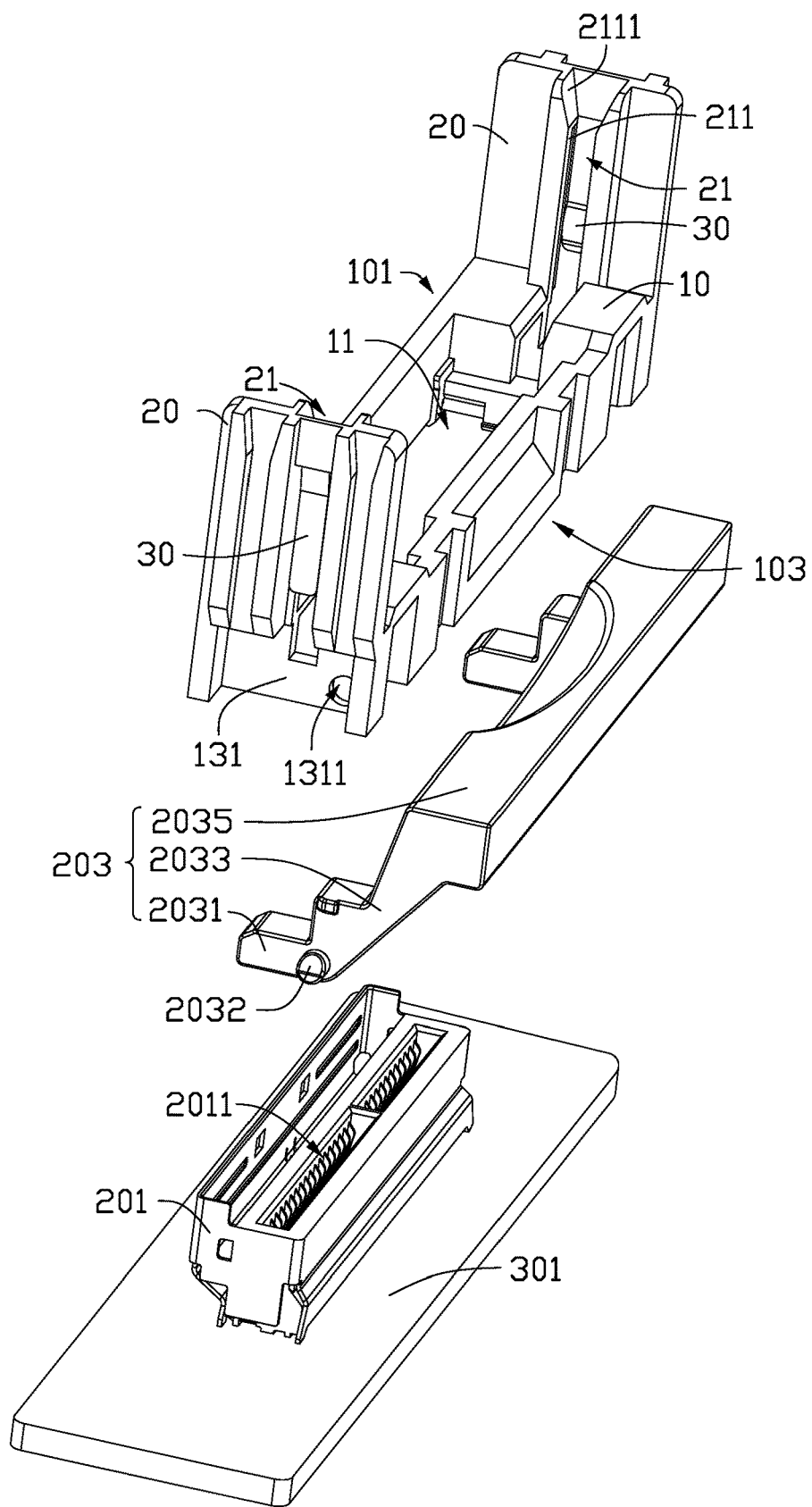
FIG. 2 is an isometric, exploded view of the electrical connection base shown in FIG. 1.

As shown in FIG. 1 and FIG. 2, in an embodiment, an electrical connection base 200 is illustrated. The electrical connection base 200 includes a pedestal 201 and a supporting element 100. The pedestal 201 is positioned on a first circuit board 301 and is electrically connected to the first circuit board 301. A socket 2011 is defined on the pedestal 201, and the socket 2011 can be configured to insert a second circuit board 303 for electrical connection to the first circuit board 301.

In an embodiment, the first circuit board 301 is a main board, and the second circuit board 303 is an expansion card. In another embodiment, the first circuit board 301 can also be a sub-circuit board electrically connected to the main board, and the second circuit board 303 can also be a cable or another component electrically switched by the electrical connection base 200.

The supporting element 100 includes an installation portion 10 and a support portion 20. Installation portion 10 is configured for an installation to an exterior of the pedestal 201. The installation portion 10 includes opposing first and second sides 101 and 103. The second side 103 of the installation portion 10 faces the first circuit board 301. A through hole 11 is defined in the installation portion 10. The through hole 11 penetrates the first side 101 and the second side 103. The installation portion 10 moves toward the first circuit board 301 and is set outside the pedestal 201, so that the pedestal 201 extends through the through hole 11. The socket 2011 is exposed from the first side 101 of the installation portion 10. The pedestal 201 may be entirely located in the through hole 11 or may partially protrude outside the through hole 11. The support portion 20 is set on the first side 101 of the installation portion 10. A first slot 21 is defined on the side of the support portion 20 facing the through hole 11, and the first slot 21 penetrates an end of the support portion 20 away from the installation portion 10.

When the second circuit board 303 is plugged into the socket 2011, the wall of the second circuit board 303 enters the first slot 21, a groove wall 211 of the first slot 21 contacts the second circuit board 303, and the support portion 20 supports the second circuit board 303 against strain and deformation.

In an embodiment, in order to facilitate entry of the wall of the second circuit board 303 in the first slot 21, a first guide surface 2111 is provided on the two opposite groove walls 211 of the first slot 21 facing away from the installation portion 10. The first guide surface 2111 is an inclined surface. In another embodiment, the first guide surface 2111 may also be a curved surface.

In an embodiment, the supporting element 100 further includes a resistance portion 30. The resistance portion 30 is positioned in the support portion 20 and in the first slot 21. The resistance portion 30 constrains and supports the part of the second circuit board 303 which is inserted into the first slot 21.

The resistance portion 30 is made of elastically deformable materials such as plastic. When second circuit boards 303 have different widths, the walls of the second circuit board 303 entering the first slot 21 bear against and compress the resistance portion 30, so that the resistance portion 30 deforms to closely fit second circuit boards 303 of different sizes.

One end of the resistance portion 30 is connected to the support rod 20, and the other end of the resistance portion 30 is a free end. The free end of the resistance portion 30 abuts on the second circuit board 303, which facilitates elastic deformation of the resistance portion 30 by different widths of second circuit boards 303.

In another embodiment, the resistance portion 30 may also be other elastic structures such as a spring in the form of a disk positioned in the first slot 21, and the resistance portion 30 will thereby bear on the second circuit board 303.

In an embodiment, there are two support portions 20. A support portion 20 is located on each side of the through hole 11. Opposite walls of the second circuit board 303 are inserted into the first slots 21 on the support portion 20, and the two support portions 20 provide support. In another embodiment, there may be only one support portion 20.

Figure 3:
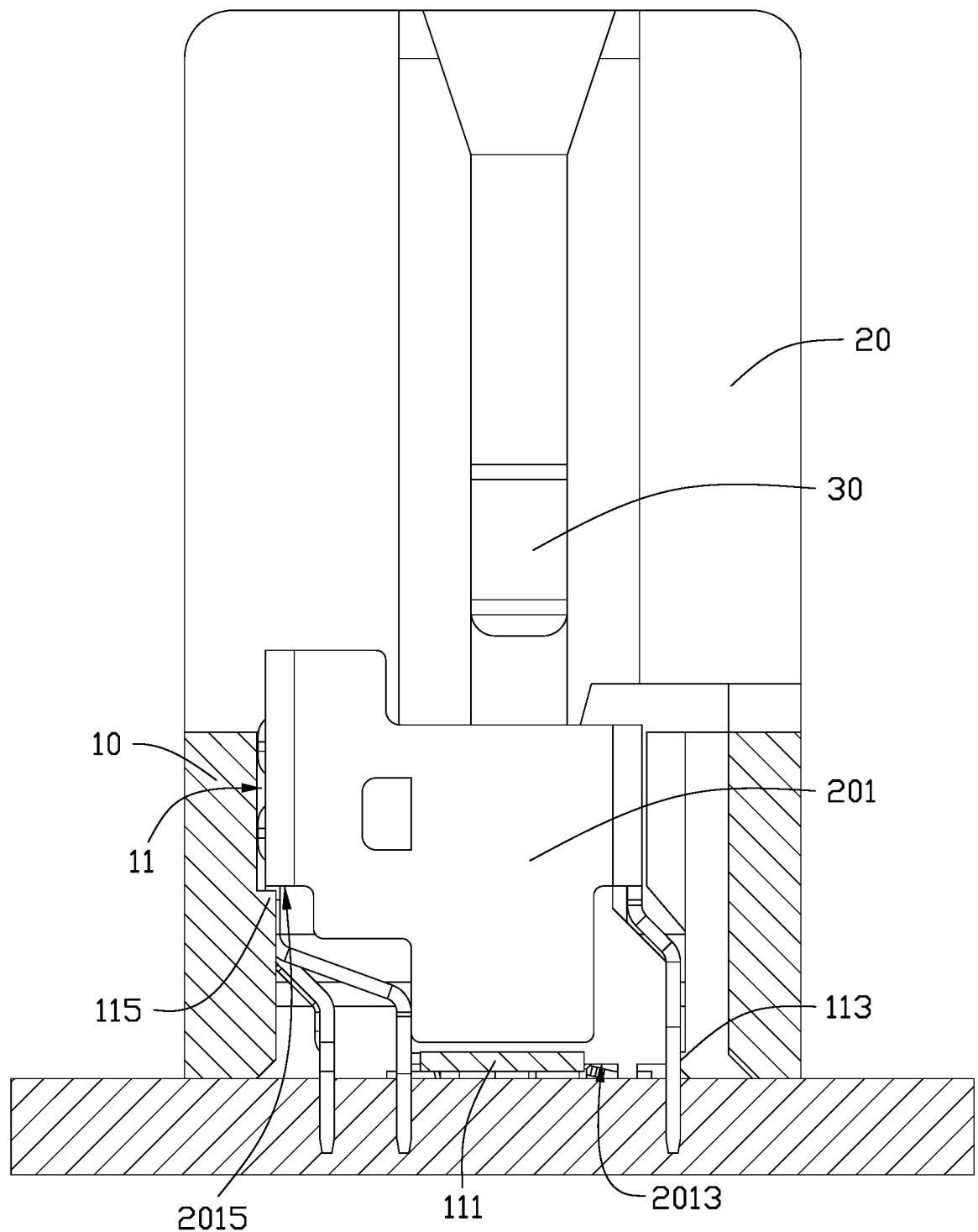
FIG. 3 is a sectional view along line A-A of FIG. 1.
Figure 4:
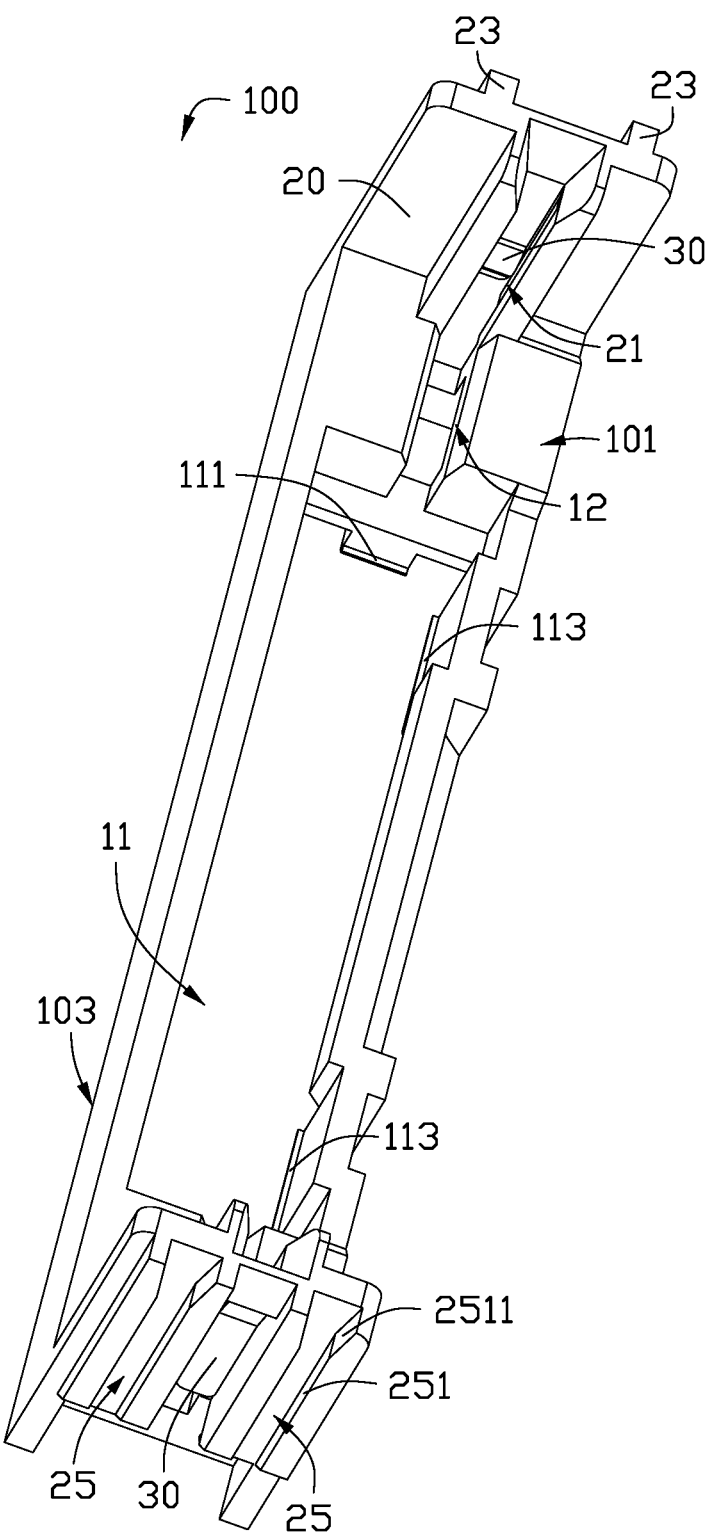
FIG. 4 is an isometric view of a supporting element in the electrical connection base shown in FIG. 1.
Figure 5:
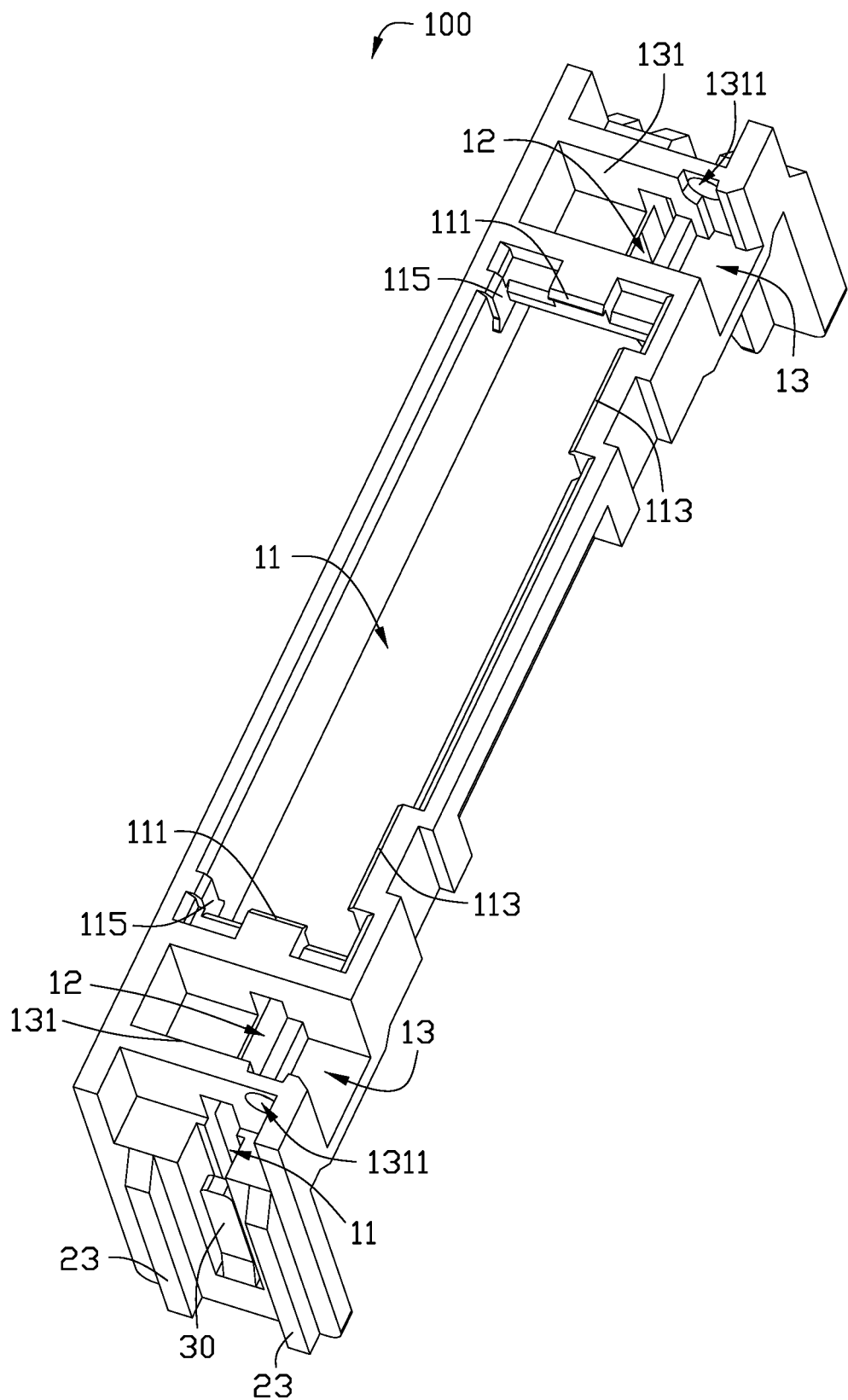
FIG. 5 is an isometric view of the supporting element shown in FIG. 4 from another perspective.

As shown in FIG. 3, FIG. 4, and FIG. 5, in an embodiment, a number of buckle parts protrude from the hole wall of the through hole 11, and the buckle parts can be buckled on a side of the pedestal 201 facing the first circuit board 301. That is, the buckle parts are located on a side of the pedal 201 away from the first side 101 of the installation portion 10. The buckle parts include two first buckles 111, two second buckles 113, and two third buckles 115. The two first buckles 111 are positioned on opposite walls of the narrow side of the through hole 11 close to the support portions 20, and the second buckle 113 and the third buckle 115 are positioned on the other two walls (the long walls) of the through hole 11. The two second buckles 113 are positioned on the same hole wall of the through hole 11, and the two third buckles 115 are positioned on the same hole wall of the through hole 11. There is a gap between a bottom wall 2013 of the pedestal 201 facing the first circuit board 301 and the first circuit board 301, and the first buckle 111 extends through through the gap and abuts the bottom wall 2013.

There is a gap between a bottom wall 2013 of the base 201 facing the first circuit board 301 and the first circuit board 301, and the second engaging portion 113 extends through the gap and abuts the bottom wall 2013. There is a gap between bottom wall 2015 of the base 201 facing the first circuit board 301 and the first circuit board 301, and the third engaging portion 115 extends through the gap and abuts the bottom wall 2015. The bottom wall 2013 and the bottom wall 2015 are on different planes.

In another embodiment, the buckle parts may be provided at other positions on the hole wall of the through hole 11, and the number of engaging portions may be one or more.

In another embodiment, the engaging portions may be omitted. The pedestal 201 and the hole wall of the through hole 11 have an interference fit or transition fit, and the hole wall of the through hole 11 presses against the outer peripheral wall of the pedestal 201. The pedestal 201 and the installation portion 10 are held firmly in place by the pressing force and friction between the hole wall of the through hole 11 and the pedestal 201.

In an embodiment, the supporting element 100 is an injection molding and an integrated structure. In the process of installing the supporting element 100 outside the pedestal 201, the buckle parts are elastically deformed and buckled outside the pedestal 201.

In another embodiment, the supporting element 100 may also be a composite structure of plastic and metal.

Figure 6:
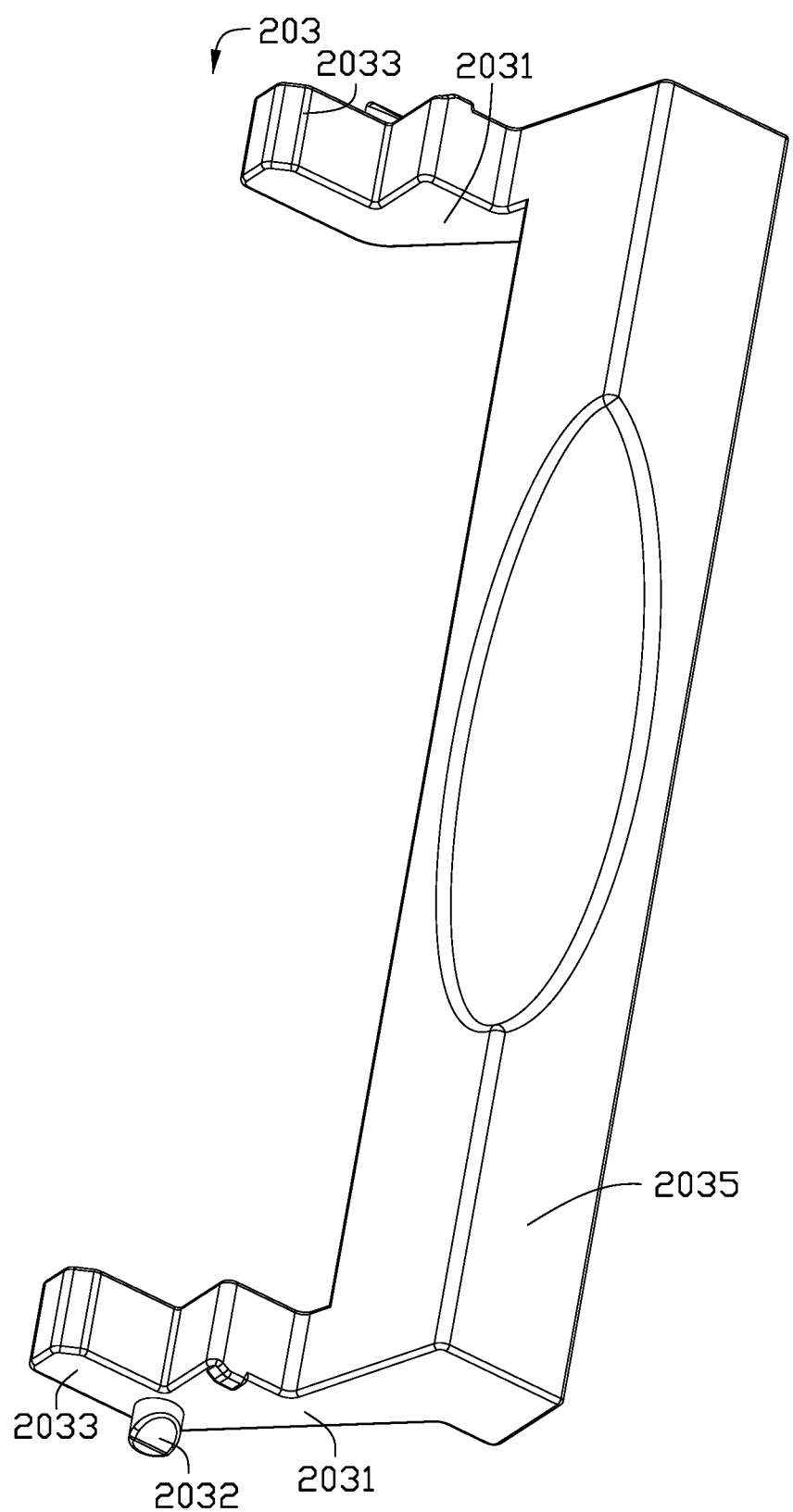
FIG. 6 is an isometric, assembled view of an operating element in the electrical connection base shown in FIG. 1.
Figure 7:
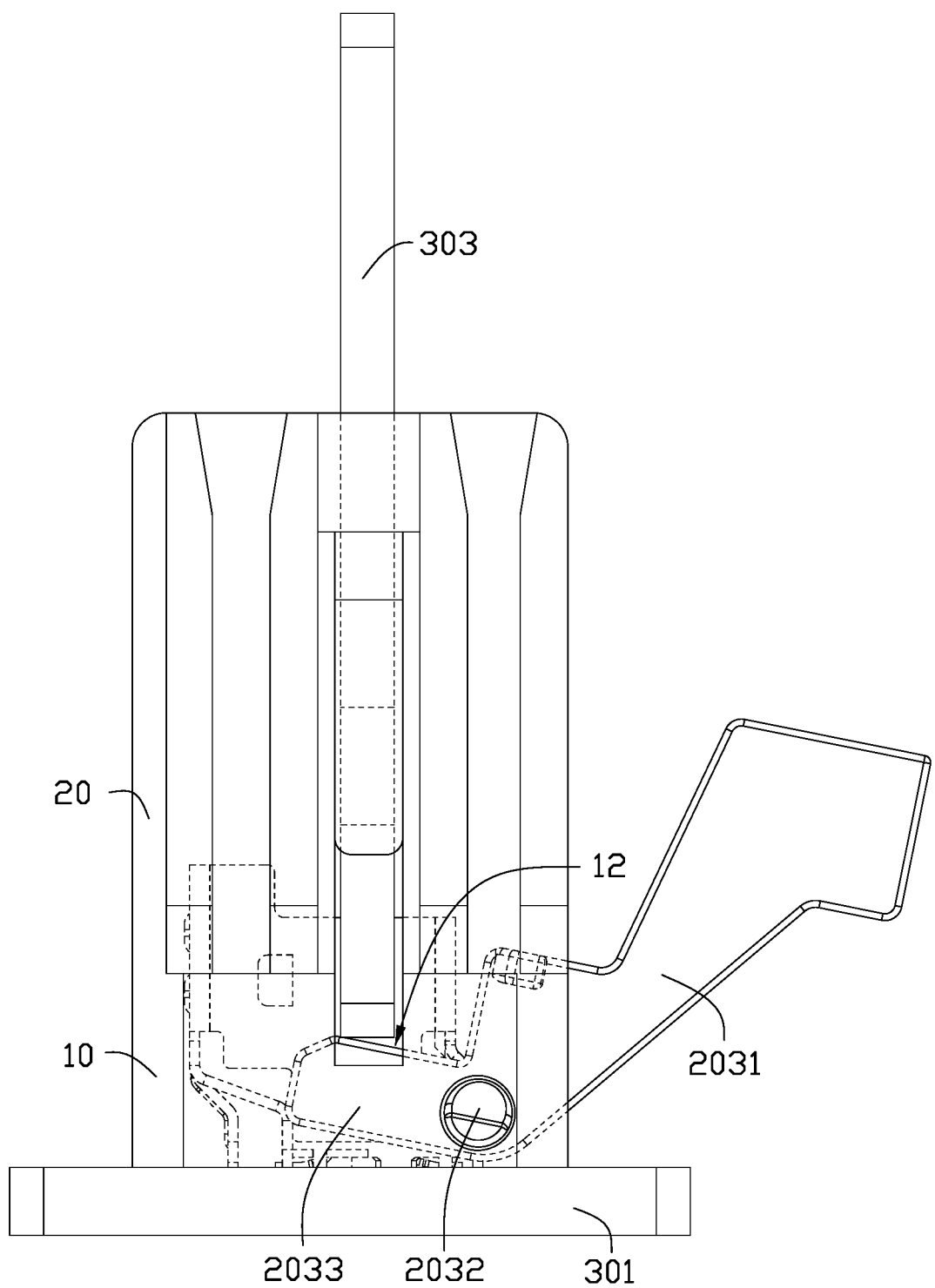
FIG. 7 is an isometric view of the electrical connection base shown in FIG. 1 wherein the electrical connection base is in a state ready for installation or removal of a second circuit board.

As shown in FIG. 6, and FIG. 7, in order to facilitate disassembly of the second circuit board 303 from the pedestal 201, the electrical connection base 200 includes an operating element 203. A second slot 12 is defined on the first side 101 of the installation portion 10. A third slot 13 is defined on the second side 103 of the installation portion 10, as shown in FIG. 5. The second slot 12 communicates with the third slot 13 and is located between the first slot 21 and the through hole 11. The second slot 12 also communicates with the first slot 21 and the through hole 11. The second circuit board 303 is substantially a rectangular plate. The side of the second circuit board 303 facing the first circuit board 301 can enter the second slot 12.

The operating element 203 includes a connecting portion 2031 and a contacting portion 2033. The connecting portion 2031 is positioned in the third slot 13 and partially protrudes out of the installation portion 10, it can be rotated. The connecting portion 2031 rotates and drives the contacting portion 2033 to enter or exit the second slot 12. When the contacting portion 2033 enters the second slot 12, the contacting portion 2033 contacts the second circuit board 303, and as the connecting portion 2031 rotates relative to the installation portion 10, the contacting portion 2033 abuts the second circuit board 303 and moves the second circuit board 303 along the first slot 21.

When the second circuit board 303 is inserted into the socket 2011, the second circuit board 303 can move toward the first circuit board 301 along the first slot 21. The second circuit board 303 presses against the contacting portion 2033 and drives the contacting portion 2033 to move until the contacting portion 2033 exits the second slot 12. The second circuit board 303 is thereby plugged into the socket 2011. The operating element 203 is relatively fixed under the second circuit board 303.

When the second circuit board 303 is disassembled, an external force is applied to the operating element 203, the connecting portion 2031 rotates relative to the installation portion 10, the contacting portion 2033 enters the second slot 12, and forces the second circuit board 303 away from the first circuit board 301 until the two are separated.

A mounting hole 1311 is defined in the groove wall 131 of the third slot 13 away from the through hole 11. The connecting portion 2031 comprises a shaft 2032. The shaft 2032 is rotatable in the mounting hole 1311.

In an embodiment, there are two second slots 12 and two third slots 13, and there are two connecting portions 2031 and two contacting portions 2033. The operating element 203 includes an operating portion 2035. One end of the operating portion 2035 is connected to an end of the connecting portion 2031 facing away from the contacting portion 2033, and the other end of the operating portion 2035 extends to one side of the connecting portion 2031. The operating portion 2035 connects the two connecting portions 2031. The external force for dismounting the second circuit board 303 is applied to the operating portion 2035, the leverage makes it easy to dismount the second circuit board 303.

In another embodiment, the number of second slots 12, third slots 13, and connecting portion 2031 and contacting portion 2033 of the operating element 203 may be one of each.

In another embodiment, the operating element 203 may be omitted, and the external force may be directly applied to the part of the connecting Portion 2031 protruding outside the installation portion 10.

In another embodiment, when the second circuit board 303 is an unusual shape, for example, the second circuit board 303 includes three sections with different heights, and the three sections can extend into the corresponding first slot 21, second slot 12 and through hole 11, the first slot 21 and through hole 11 can be disconnected from the second slot 12.

Figure 8:
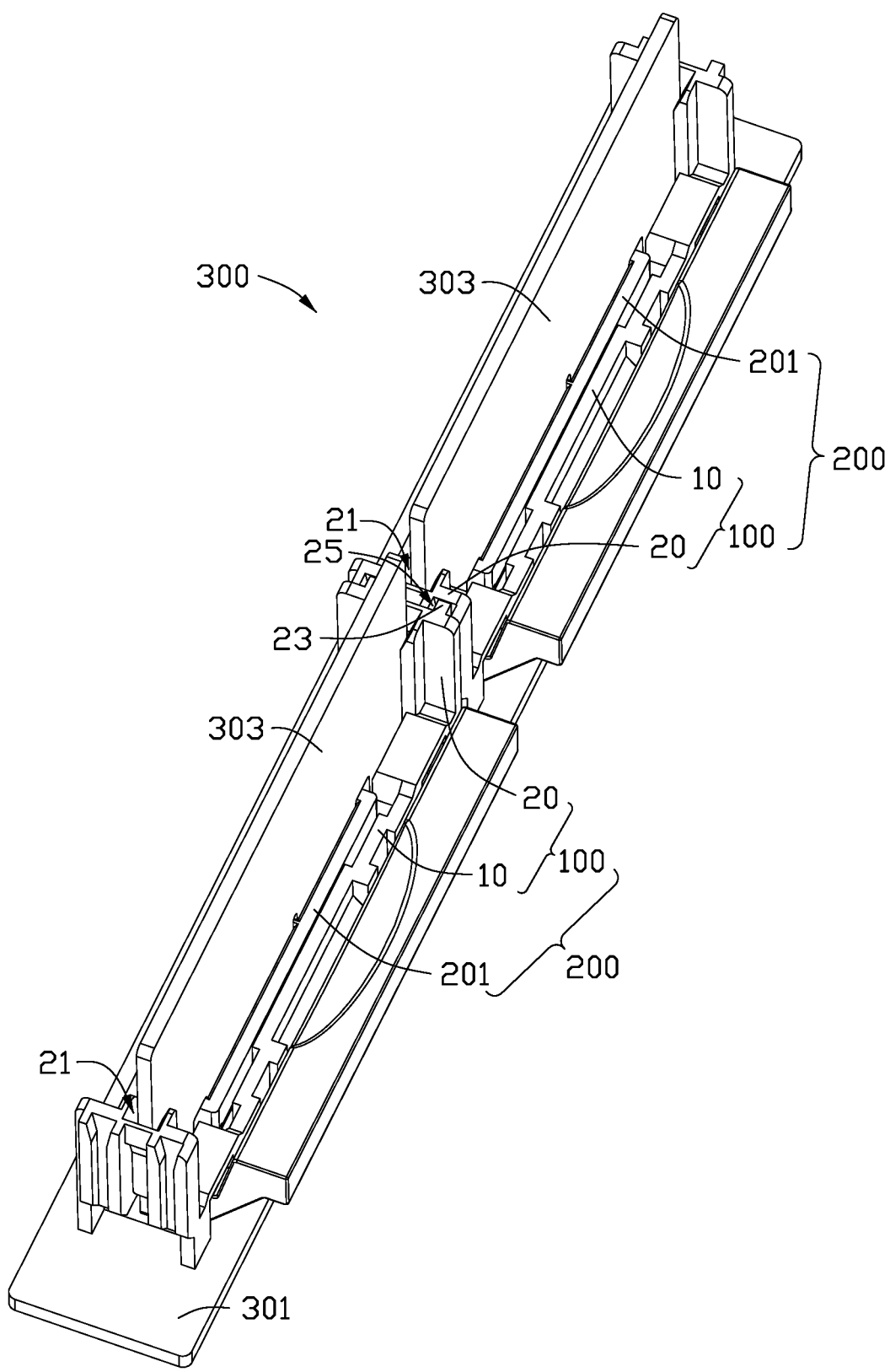
FIG. 8 is an isometric view of an electrical connection base assembly provided by an embodiment of the present application.

As shown in FIG. 4 and FIG. 8, an embodiment of the present application provides an electrical connection base assembly 300. The electrical connection base assembly 300 includes a plurality of electrical connection bases 200. Several electrical connection bases 200 are positioned on the first circuit board 301 along the connection direction of the two support portions 20 of the supporting element 100. One of the two support portions 20 of the supporting element 100 comprises a bulge card 23, and a holding slot 25 is defined on the other of the two support portions 20. The bulge card 23 and the holding slot 25 are located on opposite sides of the two support portions 20.

One second circuit board 303 can be plugged into each electrical connection base 200. Among adjacent electrical connection bases 200, the bulge card 23 of one electrical connection base 200 can be clamped into the holding slot 25 of the other electrical connection base 200. The adjacent supporting elements 100 support each other, which improves the stability of the supporting element 100 and further improves the support stability of the supporting element 100 to the second circuit board 303.

In an embodiment, the number of bulge cards 23 and holding slots 25 of each supporting element 100 is two. In another embodiment, the number of bulge cards 23 and holding slots 25 of the supporting element 100 may be one, three, four, or other number.

In order to facilitate entry of the bulge card 23 into the holding slot 25, a second guide surface 2511 is defined on the groove wall 251 of the holding slot 25.

Figure 9:
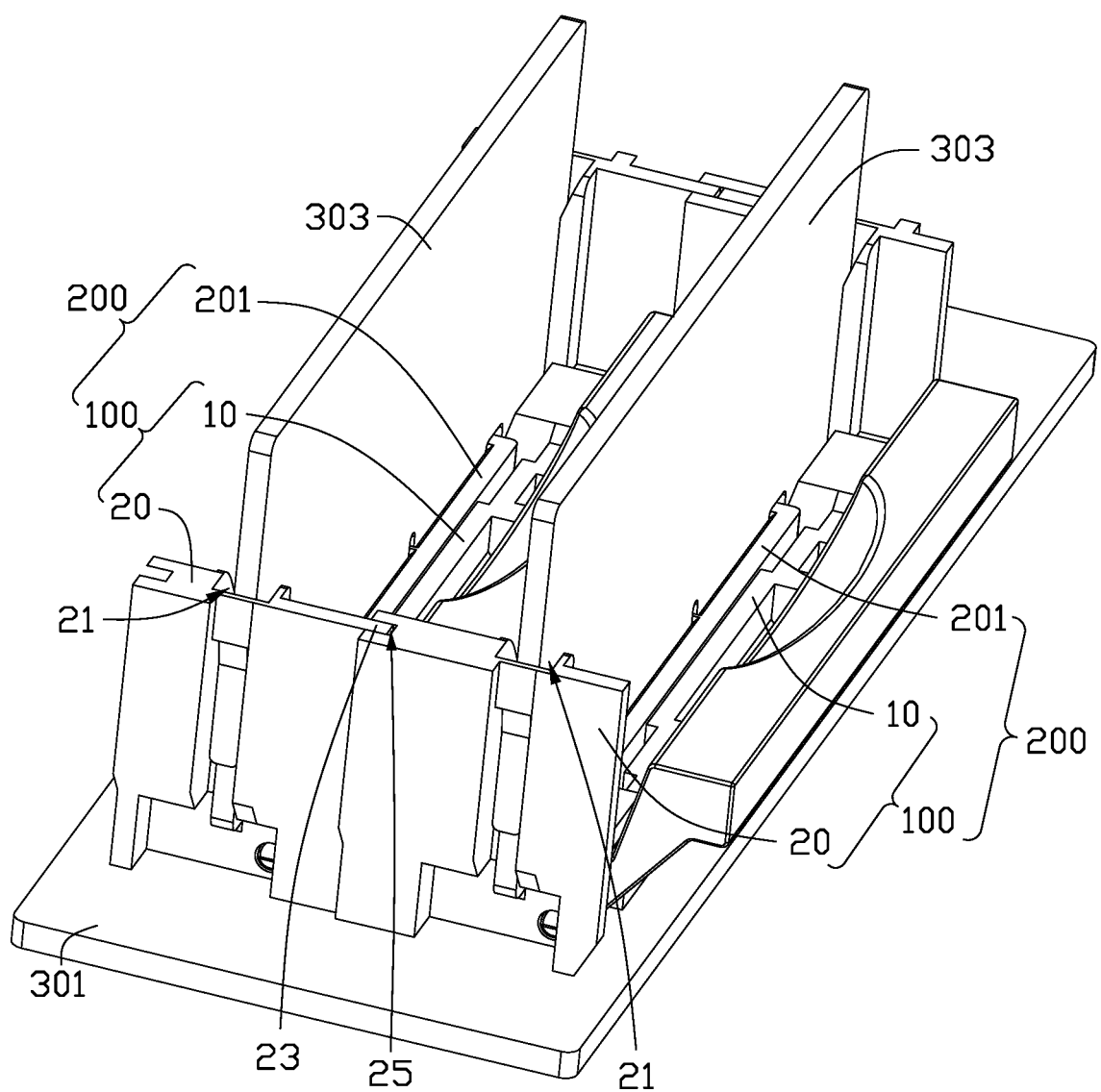
FIG. 9 is an isometric view of the electrical connection base assembly shown in FIG. 8 in another embodiment.

In another embodiment, the electrical connection bases 200 may be positioned on the first circuit board 301 along a direction perpendicular to the connecting line between the two support portions 20 of the supporting element 100, as shown in FIG. 9. Accordingly, the bulge card 23 and the holding slot 25 are positioned on opposite sides of the same support portion 20 along the arrangement direction of the electrical connection bases 200.

Figure 10:
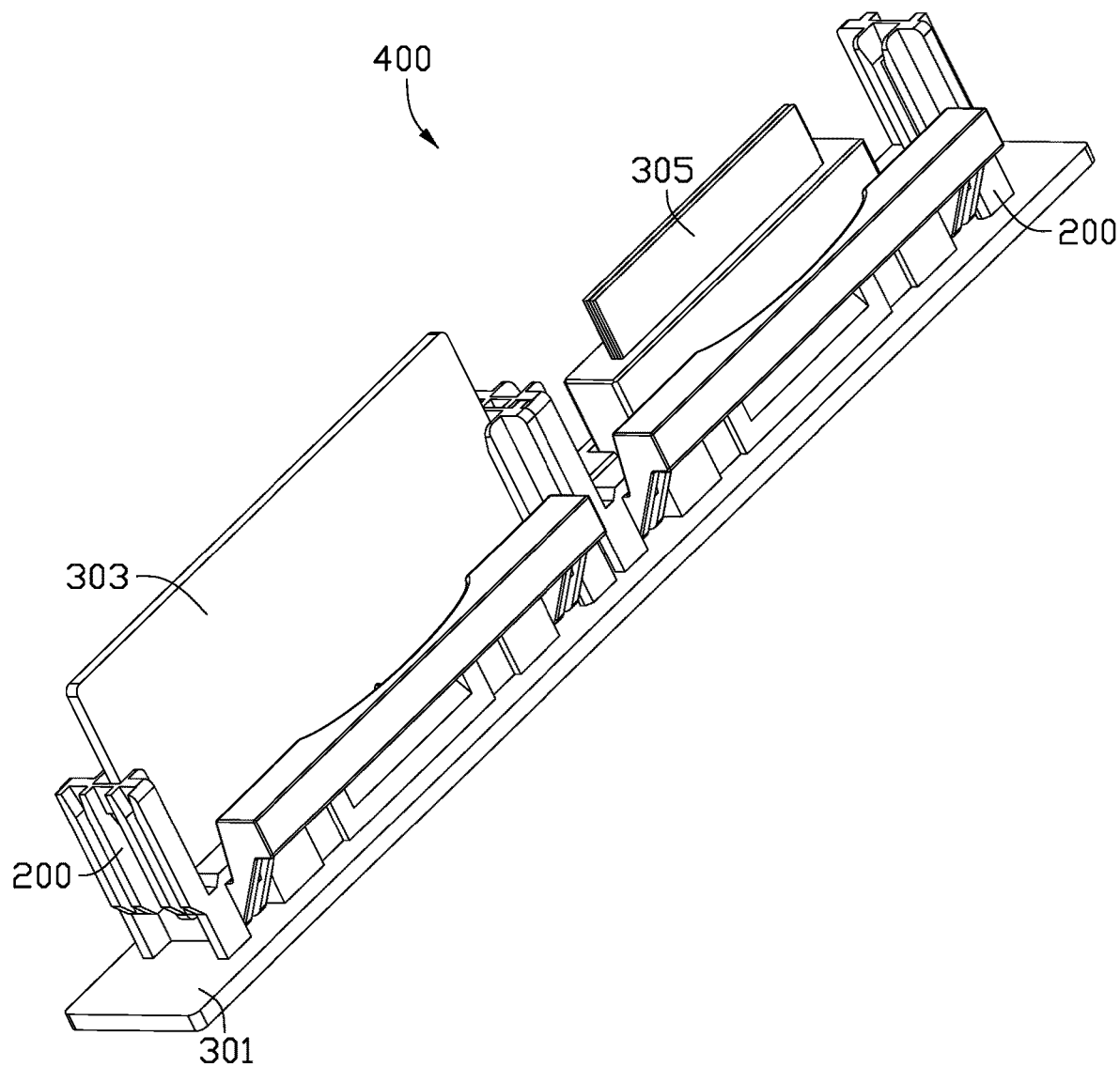
FIG. 10 is an isometric view of an electrical connector provided by an embodiment of the present application.

The socket 2011 is not limited to the second circuit board 303 plugging into it. For example, in another embodiment, as shown in FIG. 10, an embodiment of the present application provides an electrical connector 400. The electrical connector 400 includes two electrical connection bases 200, two first circuit boards 301, one second circuit board 303, and one cable 305. Two electrical connection bases 200 are positioned on the first circuit boards 301, and one of the electrical connection bases 200 is plugged into a cable 305. The supporting element 100 is set outside the pedestal 201 and does not affect the cable 305 plugged into the pedestal 201.

In another embodiment, the electrical connector 400 includes one electrical connection base 200, one first circuit board 301, and one second circuit board 303 or cable 305. The second circuit board 303 or cable 305 is plugged into the electrical connection base 200.

In the electrical connection base 200, the supporting element 100 is set outside the pedestal 201, and the first slot 21 is defined on the supporting element 100, so that the part of the element plugged into the socket 2011 and outside the pedestal 201 is inserted into the first slot 21. The groove wall 211 of the first slot 21 is in contact with the element, so that the support portion 20 supports the element and prevents deformation of the element.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:
1. An electrical connection base comprising:
a pedestal configured to be positioned on a first circuit board; a socket defined on the pedestal and configured to receive a second circuit board for establishing electrical connection between the second circuit board and the first circuit board; and
a supporting element comprising:
an installation portion, a through hole defined on the installation portion, wherein the installation portion is installed to an exterior of the pedestal, and the pedestal extends through the through hole, and the socket is exposed from a first side of the installation portion; and
at least one support portion positioned on a first side of the installation portion and outside of the through hole, wherein a first slot is defined on a side of the support portion facing the through hole, and the first slot penetrates an end of the support portion away from the installation portion;
when the second circuit board is plugged into the socket, the wall of the second circuit board is in the first slot, a groove wall of the first slot contacts the second circuit board, and the support portion supports the second circuit board.
2. The electrical connection base of claim 1, wherein:
a buckle part protrudes from a hole wall of the through hole, and the buckle part is located on a side of the pedestal away from the first side of the installation portion.
3. The electrical connection base of claim 2, wherein:
a gap between a bottom wall of the pedestal and the first circuit board is defined, and the buckle part extends through the gap and abuts on the bottom wall.

4. The electrical connection base of claim 1, wherein:
the pedestal and a hole wall of the through hole are in interference fit or transition fit, and the hole wall of the through hole presses an outer peripheral wall of the pedestal.

5. The electrical connection base of claim 1, wherein:
a second slot is defined on the first side of the installation portion, the electrical connection base further comprises an operating element, the operating element comprises at least one connecting portion and at least one contacting portion connected to a respective one of the at least one connecting portion;
the connecting portion is rotatably positioned on the installation portion and partially protrudes from the installation portion; the connecting portion rotates and drives the contacting portion to enter or exit the second slot.

6. The electrical connection base of claim 5, wherein:
a third slot is defined on a second side of the installation portion, and the first side and the second side that are opposite sides of the installation portion;
the second slot communicates with the third slot and is located between the first slot and the through hole;
the connecting portion is rotatably positioned in the third slot.

7. The electrical connection base of claim 6, wherein:
the second slot communicates with the first slot and the through hole.

8. The electrical connection base of claim 6, wherein:
a mounting hole is defined in the groove wall of the third slot;
the connecting portion comprises a shaft, and the shaft is rotatably in the mounting hole.

9. The electrical connection base of claim 8, wherein:
the mounting hole is located in the groove wall of the third slot away from the through hole.

10. The electrical connection base of claim 5, wherein:
the operating element further comprises an operating portion, one end of the operating portion is connected to an end of the connecting portion facing away from the contacting portion, and the other end of the operating portion extends to one side of the connecting portion.

11. The electrical connection base of claim 10, wherein:
there are two support portions, the two support portions are located on opposite sides of the through hole.

12. The electrical connection base of claim 11 comprising:
two of the connecting portions and two of the contacting portions, the first slot is defined on each of the support portions, the two connecting portions are positioned at intervals on the installation portion, and the operating portion is connected to the two connecting portions.

13. The electrical connection base of claim 1, wherein:
when the wall of the second circuit board is in the first slot; the resistance portion is positioned in the support portion and in the first slot, the resistance portion resists the second circuit board plugged into the first slot.

14. The electrical connection base of claim 13, wherein:
the resistance portion is made of elastically deformable materials.

15. The electrical connection base of claim 14, wherein:
one end of the resistance portion is connected to the support rod, and the other end of the resistance portion is a free end.

16. The electrical connection base of claim 1, wherein:
a first guide surface is provided on the two opposite groove walls of the first slot facing away from the installation portion.

17. The electrical connection base of claim 1 comprising:
two of the support portions, the two support portions are located on opposite sides of the through hole;
one of the two support portions comprising a bulge card; and a holding slot is defined in the other of the two support portions;
the bulge card and the holding slot are located on opposite sides of the two support portions.

18. The electrical connection base of claim 17, wherein:
a second guide surface is defined on the groove wall of the holding slot, and the second guide surface is located at the end of the support portion away from the installation portion.

19. An electrical connection base assembly comprising:
a plurality of electrical connection bases, each of the plurality of electrical connection bases comprising:
a pedestal a socket defined on the pedestal and configured to receive a second circuit board to establish electrical connection between the second circuit board and a first circuit board; and
a supporting element comprising:
an installation portion, a through hole defined on the installation portion, wherein the installation portion is installed to an exterior of the pedestal, and the pedestal extends through the through hole, and the socket is exposed from a first side of the installation portion; and
two of the support portions positioned at intervals on the first side of the installation portion, and located on both sides of the through hole, wherein when the second circuit board is plugged into the socket, the wall of the second circuit board is in the first slot, a groove wall of the first slot contacts the second circuit board, and the support portion supports the second circuit board;
a first slot defined on a side of the support portion facing the through hole, and the first slot penetrating an end of the support portion away from the installation portion; wherein:
the plurality of the electrical connection bases are positioned in sequence, one of the two support portions of the supporting element comprises a bulge card, and a holding slot is defined on another of the two support portions, and the bulge card and the holding slot are located on opposite sides of the two support portions.

20. An electrical connector comprising:
a first circuit board;
a second circuit board or a cable; and
an electrical connection base comprising:
a pedestal positioned on the first circuit board and electrically connected to the first circuit board; a socket defined on the pedestal; and
a supporting element comprising:
an installation portion, a through hole defined on the installation portion, wherein the installation portion is installed to an exterior of the pedestal, and the pedestal extends through the through hole, and the socket is exposed from a first side of the installation portion, and is configured to receive the second circuit board or the cable to establish electrical connection between the second circuit board and the first circuit board; and at least one support portion positioned on the first side of the installation portion, a first slot defined on a side of the support portion facing the through hole, and the first slot penetrating an end of the support portion away from the installation portion, wherein when the second circuit board is plugged into the socket, the wall of the second circuit board is in the first slot, a groove wall of the first slot contacts the second circuit board, and the support portion supports the second circuit board; and the second circuit board or the cable is in the first slot.

\* \* \* \* \*